United States Patent [19]

Maeda et al.

[11] Patent Number: 5,576,572
[45] Date of Patent: Nov. 19, 1996

[54] SEMICONDUCTOR INTEGRATED CIRCUIT DEVICE AND METHOD OF MANUFACTURING THE SAME

[75] Inventors: Takeo Maeda, Tokyo; Hiroshi Gojohbori, Yokohama, both of Japan

[73] Assignee: Kabushiki Kaisha Toshiba, Kawasaki, Japan

[21] Appl. No.: 235,214

[22] Filed: Apr. 29, 1994

Related U.S. Application Data

[63] Continuation of Ser. No. 45,125, Apr. 12, 1993, abandoned.

[30] Foreign Application Priority Data

Apr. 13, 1992 [JP] Japan ................................. 4-119804

[51] Int. Cl.$^6$ ................................................. H01L 29/76
[52] U.S. Cl. ...................... 257/378; 257/591; 257/607; 257/755
[58] Field of Search .................................. 257/378, 607, 257/588, 591, 751, 755

[56] References Cited

U.S. PATENT DOCUMENTS

| | | | |
|---|---|---|---|
| 5,001,081 | 3/1991 | Tuntasood et al. | 257/378 |
| 5,089,433 | 2/1992 | Anand et al. | 257/378 |
| 5,091,760 | 2/1992 | Maeda et al. | 257/377 |
| 5,150,184 | 9/1992 | Eklund | 257/378 |
| 5,221,853 | 6/1993 | Joshi et al. | 257/755 |

FOREIGN PATENT DOCUMENTS

| | | | |
|---|---|---|---|
| 1196142 | 8/1989 | Japan | 257/915 |

*Primary Examiner*—Mark V. Prenty
*Attorney, Agent, or Firm*—Finnegan, Henderson, Farabow, Garrett & Dunner, L.L.P.

[57] ABSTRACT

A semiconductor integrated circuit device having a bipolar transistor and contact in the form of a wired layer by using different impurities for doping the emitter electrode and the wired layer of the device, both of which are made of polysilicon. The emitter electrode, formed on an emitter region of a p-type silicon semiconductor substrate, is doped with an n-type impurity having a low diffusion coefficient. A polysilicon wired layer, formed on an impurity diffusion region in an active region of the semiconductor substrate, is doped with another impurity that can effectively destroy native oxide films. With such an arrangement of selectively using impurities, the temperature of thermally treating the emitter region can be less than 850° C.

9 Claims, 4 Drawing Sheets

PMOS    NMOS    BIPOLAR

SEMICONDUCTOR INTEGRATED CIRCUIT DEVICE AND METHOD OF MANUFACTURING THE SAME

This application is a continuation, of application Ser. No. 08/045,125 filed Apr. 12, 1993, now abandoned.

BACKGROUND OF THE INVENTION

1. Field of the Invention

This invention relates to a semiconductor integrated circuit device and, more particularly, it relates to a hybrid LSI having a combination of bipolar/CMOS transistors.

2. Description of the Related Art

It has been generally recognized that a major disadvantage of a semiconductor device having a CMOS feature is that parasitic circuits are inevitably produced to give rise to a latch-up phenomenon. Nevertheless, the semiconductor device of this type has been attracting attention in the field of LSI technology because of its low energy consumption level. A BiCMOS LSI is particularly advantageous because it include the feature of a combination of high integration and low energy consumption of CMOSs and high driving force and high speed of bipolar transistors, and has a variety of practical applications. CMOS LSIs including BiCMOS LSIs are, however, accompanied by a disadvantage of being liable to a short channel effect as smaller CMOSs are used. This effect is believe to be principally a function of the degree of extension of the diffusion layers of the source and drain regions of the device. The CMOS LSI device needs to be heat-treated at relatively low temperature to suppress the short channel effect. As a popular practice for reducing the cost of manufacturing a CMOS LSI, a same polysilicon film is often used as a second polysilicon layer for both the emitter electrode and the wired layer of the LSI. As the polysilicon layer is oxidized with time at the surface, the native oxide film formed between the polycrystalline silicon and the silicon substrate supporting the polysilicon layer grows to increase the contact resistance between them. It is also a popular practice to inject an impurity substance into the polycrystalline silicon and heat treat it at high temperature to destroy the native oxide film.

Figure 1:
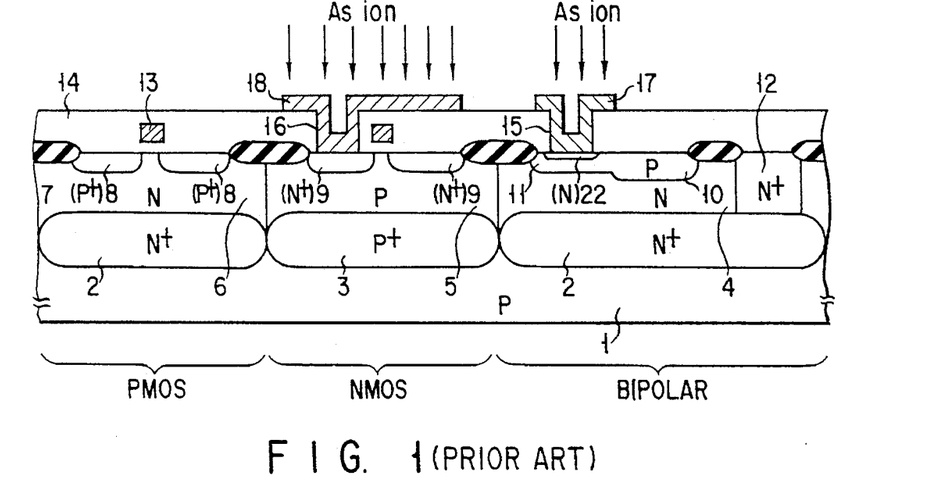
FIG. 1 is a schematic sectional view of a conventional BiCMOS semiconductor device.

FIG. 1 of the accompanying drawings is a schematic sectional view of a principal area of a conventional BiCMOS semiconductor device. A pair of buried $n^+$ regions 2 are formed on a p-type silicon substrate to produce a p-channel MOSFET and a bipolar transistor, while a buried p+ region 3 is also formed on the substrate to produce an n-channel MOSFET. Then, a thin n-type epitaxial layer 4 is formed on the substrate. An n well 6 and a p well 5 are formed in the epitaxial layer 4. Thereafter, a deep $n^+$ region 12 extending from the surface of the epitaxial layer 4 to the $n^+$ region 2 is formed for the bipolar transistor of the device. Then, the functional elements of the device are isolated from one another. The operation of isolation is carried out by selectively forming thick field oxide film regions 7 on the surface of the wafer and subsequently channel stopper regions (not shown) in respective areas of the epitaxial layer 4 located under the respective field oxide film regions 7. The field oxide film regions 7 and the corresponding respective channel stopper regions are self aligned so as to minimize the overall area of the field oxide film regions 7. As the result of the operation of isolation, a plurality of regions are defined to produce various functional elements of the device including a p-channel MOSFET (hereinafter referred to as PMOS), an n-channel MOSFET (hereinafter referred to as NMOS) and a bipolar transistor.

After removing the native oxide film to expose the surfaces of the regions of the functional elements of the device, the silicon substrate is oxidized to form a silicon oxide ($SiO_2$) film (not shown) having a thickness approximately between 50 and 200 angstroms (hereinafter expressed as Å that operates as a dummy gate oxide film). Thereafter, ions are injected into the N– and PMOS, or the wells 5 and 6, to give them respective predetermined impurity concentrations. Thus, the N– and PMOS come to show respective threshold voltages. After removing the dummy gate oxide film, a real gate oxide film is formed and then gate electrodes 13 are formed thereon. The first polysilicon layer is used for the gate electrodes. Since the polysilicon electrodes are capable of aligning themselves to the respective source/drain regions to be subsequently formed, such an arrangement is particularly advantageous for an enhanced degree of integration. More specifically, the polysilicon electrode is typically produced by forming an undoped polysilicon film on the semiconductor substrate, diffusing phosphorus into the undoped polysilicon film to a high concentration and transforming it into an n-type layer and etching the film with precision by means of a reactive ion etching technique or a similar high precision technique. Since the gate electrodes 13 are also used as a wired layer, the use of a layer of a silicide obtained by using a metal such as W, Mo, Ti, Pt, Ni or Co or a two layered structure including a silicide layer and a polysilicon layer obtained by causing any of the above mentioned metals and polysilicon to react with each other may be recommended.

$P^+$ and $n^+$ source/drain regions 8 and 9 are formed by using the gate electrodes 13 and the field oxide film regions 7 as masks and injecting ions into respective regions. When injecting ions of an n type impurity substance into the NMOS region 5 to produce $n^+$ source/drain regions 9, the PMOS region 6 and the bipolar transistor region 4 are masked by a photoresist layer. When, on the other hand, injecting ions of a p-type impurity into the PMOS region 6 to produce p+ source/drain regions 8, the NMOS region 5 and the bipolar transistor region 4 are also masked by a photoresist layer. Arsenic (As) is typically used as an n-type impurity, whereas B or boron fluoride is used as a p-type impurity. In order to improve the reliability of the NMOS, a low concentration impurity-diffused region ($n^-$ region) is often formed adjacent to a high concentration impurity-diffused region ($n^+$ region) to transform the source/drain regions into lightly doped drain source (LDD) regions. The $n^-$ region reduces the potential level of any high potential electric fields that may be generated in the vicinity of the $n^+$ drain regions and suppresses the generation of hot carriers. Thereafter, a p-type base region is formed on the bipolar transistor.

After producing the impurity-diffused regions, the surface of the wafer including the areas of the gate electrodes 13 is covered by an insulation film 14. A multi-layer film including a non-doped CVDSiO₂ film and a phosphorus glass film such as a phosphosilicate glass (PSG) film or a borophosphosilicate glass (BPSG) film is normally used for the insulation film 14. Since the fluidity of a phosphorus glass film can be modified by heat treatment depending on the extent of phosphorus doping, it is advantageously used to provide a flat surface to LSI devices. Additionally, since a phosphorus-glass film getters harmful alkali metal ions, it can also be utilized as a passivation film. Contact holes 16, 15 are appropriately formed in respective areas of the insulation film 14 that cover the N– and PMOS regions 5 and 6 in order to partially expose the source/drain regions 9 of the NMOS region 5 and the internal base region 11 of the PMOS region 4. Then, a second polysilicon layer is deposited on the insulation film 14 and, thereafter, both an emitter electrode 17 that contacts the internal base region 11 via the contact hole 15 of the bipolar transistor region 4 and a polysilicon wired layer 18 connected to the source/drain regions 9 of the NMOS region 5 via the contact hole 16 are formed by means of an ordinary photography technique. Then, As ions are injected into the polysilicon wired layer 18 and the polysilicon emitter electrode 17 to a high concentration. Subsequently, an interlayer insulation film (not shown) of BPSG is formed on the semiconductor substrate to cover the polysilicon wired layer 18 and the emitter electrode 17. Thereafter, the interlayer insulation film is made to reflow at approximately 900° C. and As ions contained in the emitter electrode 17 are diffused into the internal base region 11, to which an external base region 10 is directly connected, to produce an emitter region 22 there. Then, the device is subjected to a series of work steps including Al wiring and formation of a passivation film.

As described above, in a conventional process of manufacturing a semiconductor device, or an LSI, As ions are injected into both the emitter electrode region and the wired layer regions made of a polysilicon film. Now, since the heat treatment operation of diffusing the impurity substance contained within the emitter electrode region is conducted at approximately 900° C., the wired layer regions and the active region of the semiconductor substrate are put into an excellent contact condition with respect to each other and a high performance bipolar transistor is realized by making the emitter region rather shallow. On the other hand, however, as the semiconductor device is down-sized to show a minimum gate length of less than 0.5 μm in the CMOS, the heat treatment temperature will need to be lowered to less than approximately 850° C. in order to avoid a short channel phenomenon and other undesirable phenomena that may appear when the heat treatment is carried out at a temperature higher than 900° C. Additionally, since the contact area will become less than $0.8 \times 0.8$ μm$^2$ it will be extremely difficult to destroy the native oxide film that may be formed to a thickness of 10 to 20 Å on the source/drain regions of the n-type structure such as NMOS. In order to solve this problem, phosphorus which has a remarkable effect of destroying native oxide film may additionally be injected into the polycrystalline silicon of the wired layer. A native oxide film that has been formed on the base p$^-$-type region of the emitter electrode normally has a thickness between 5 and 12 Å and can be easily destroyed by using any appropriate impurity substance.

On the other hand, when phosphorus is used as an impurity injected into the emitter electrode, it cannot produce a shallow emitter region because of its high thermal diffusion coefficient and the use of phosphorus can result in a poor performance of the bipolar transistor.

SUMMARY OF THE INVENTION

In view of the above problems, it is therefore an object of the present invention to provide a semiconductor integrated circuit device including a high performance bipolar transistor and a wired layer having an excellent contact property which are made of a same polysilicon film realized by injecting different impurities respectively into the emitter electrode forming region and the wired layer forming regions of the device as well as a method of manufacturing such a semiconductor integrated circuit device.

According to an aspect of the present invention, a method of manufacturing a semiconductor integrated circuit device is provided having a BiCMOS feature comprising the steps of forming wired layer regions and an emitter electrode region from a single polysilicon film layer, injecting an n-type impurity having a noticeable effect of destroying native oxide film into the wired layer regions and another n-type impurity having a small thermal diffusion coefficient into the emitter electrode region and heat treating the device at a temperature lower than 850° C. to produce an emitter region.

According to another aspect of the present invention, a semiconductor integrated circuit device is provided comprising a semiconductor substrate, a bipolar transistor formed on the substrate and provided with an emitter region, a MOS transistor formed on the semiconductor substrate and provided with n-type source/drain regions, an emitter electrode formed on an emitter region on the semiconductor substrate and made on polysilicon doped with an n-type impurity having a small diffusion coefficient and a polysilicon wired layer formed on one of the n-type source/drain regions and doped with an n-type impurity capable of effectively destroying native oxide films. A high melting point metal film or a film of silicide of a high melting point metal may preferably be formed on the surface of the emitter electrode and that of the polysilicon wired layer. The n-type impurity capable of effectively destroying native oxide films is phosphorus and the n-type impurity having a small diffusion coefficient is As or Sb. The high melting point metal is selected from a group of metals constituted by W, Mo, Ti, Ni, Co and Pt and the silicide is selected from a group of silicides including tungsten silicide, molybdenum silicide, titanium silicide and tantalum silicide. A barrier metal may be interposed between the silicide film and the polysilicon wired layer or the emitter electrode.

According to still another aspect of the present invention, a method of manufacturing a semiconductor integrated circuit device is provided comprising the steps of forming a bipolar transistor having an emitter region on a semiconductor substrate, forming a MOS transistor having n-type source/drain regions on the semiconductor substrate, forming a polysilicon film on the semiconductor substrate, etching the polysilicon film to produce an emitter electrode in contact with the emitter region and polysilicon wired layer in contact with the n-type source/drain regions, masking the polysilicon wired layer and doping the emitter electrode with an n-type impurity having a small diffusion coefficient, masking the emitter electrode and doping the polysilicon wired layer with another n-type impurity capable of effectively destroying native oxide films, heat treating the surface of the semiconductor substrate to diffuse the n-type impurity contained in the polysilicon wired layer as a result of doping the semiconductor substrate and forming the emitter region on the surface of the semiconductor substrate.

According to still another aspect of the present invention, a method of manufacturing a semiconductor integrated circuit device is provided comprising the steps of forming a bipolar transistor having an emitter region on a semiconductor substrate, forming a MOS transistor having n-type source/drain regions on the semiconductor substrate, forming a polysilicon film on the semiconductor substrate, etching the polysilicon film to produce an emitter electrode in contact with the emitter region and a polysilicon wired layer in contact with the n-type source/drain regions, doping the polysilicon wired layer and the emitter electrode with an n-type impurity having a small diffusion coefficient, masking the emitter electrode and doping the polysilicon wired layer with another n-type impurity capable of effectively destroying native oxide films, heat treating the surface of the semiconductor substrate to diffuse the n-type impurity contained in the polysilicon wired layer as a result of doping the semiconductor substrate and forming the emitter region on the surface of the semiconductor substrate. It is required that the heat treatment be conducted at a temperature lower than 850° C.

No native oxide film would be formed on the emitter region to a thickness substantially equal to that of the oxide film on the n-type source/drain regions that are doped with an impurity to a high concentration because the doped area of the emitter region is limited to its base region. Consequently, the emitter electrode region may be doped with an impurity such as As or Sb which is relatively less effective in destroying native oxide films but has a low thermal diffusion coefficient in order to keep the depth of diffusion relatively low in the emitter region, whereas the wired area is doped with an impurity such as phosphorus capable of effectively destroying native oxide films in order to effectively and efficiently destroy any native oxide film formed there although it may have a high thermal diffusion coefficient. By selectively using different impurities, the temperature for heat treating the emitter region can be made as low as less than 850° C.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Now, the present invention will be described in greater detail by referring to the accompanying drawings that illustrate preferred embodiments of the present invention.

Figure 2:
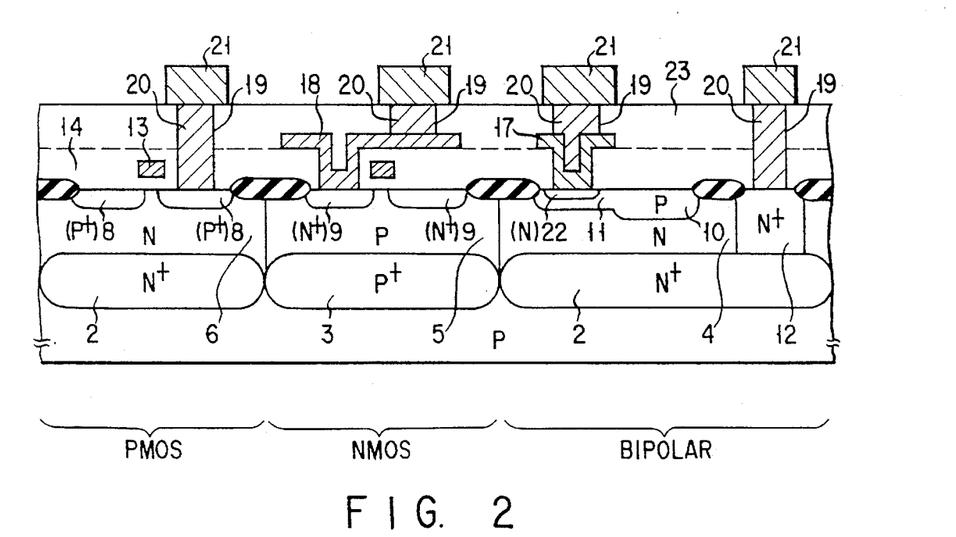
FIG. 2 is a schematic sectional view of a preferred embodiment of a BiCMOS semiconductor device of the present invention.

FIGS. 2 through 7 illustrate a first embodiment of the invention. FIG. 2 is a sectional view of the embodiment showing a principal area. Referring to FIG. 2, a polysilicon wired layer 18 is disposed on an $n^+$ region 9 which may be a source region of an NMOS as illustrated and connected to an external circuit (not shown). The wired layer 18 is doped with an impurity such as phosphorus that can effectively destroy any oxide films that may be formed on silicon to an elevated concentration in order to reduce the contact resistance between it and the source region or a drain region disposed adjacent to it. On the other hand, an emitter electrode 17 is disposed on an emitter region 22 and doped with an impurity having a relatively small diffusion coefficient such as As.

Figure 3:
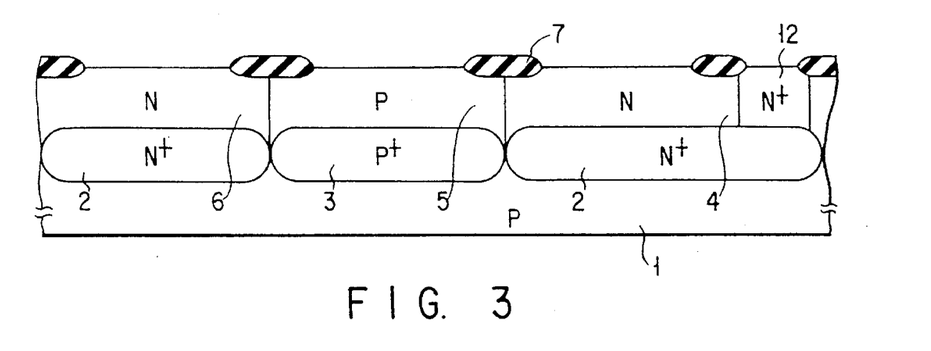
FIGS. 3 through 7 are sectional views of the embodiment of FIG. 2, showing different steps of the process of producing the semiconductor device of the present invention.

A semiconductor device having a configuration as illustrated in FIG. 2 is prepared in a manner as described below by referring to FIGS. 3 through 7. As shown in FIG. 3, a pair of buried $n^+$ regions 2 are formed on a p-type silicon semiconductor substrate to provide respective areas for producing a PMOS transistor and a bipolar transistor, while a buried $p^+$ region 3 is formed on the same substrate to provide an area for producing an NMOS transistor. Thereafter, a thin n-type epitaxial layer 4 is formed on the semiconductor substrate to a thickness of approximately 1.2 µm. Then, an n well 6 for the PMOS and a p well 5 for the NMOS are formed respectively on one of the $n^+$ regions 2 and the p+ region 3 within the epitaxial layer 4. Both wells have a maximum impurity concentration level of approximately $1\times10^{17}/cm^3$. Then, another $n^+$ region 12 is formed on the n-type epitaxial region to be used for the bipolar transistor, extending from the surface and reaching as deep as the buried $n^+$ region 2. Thereafter, the different elements of the device are isolated from one another by selectively forming field oxide film regions 7 on the surface of the wafer and, subsequently, channel stopper regions (not shown) in the respective field oxide film regions 7 within the epitaxial layer 4. The field oxide film regions 7 normally have a thickness of approximately 6,000 Å. The regions of the PMOS, NMOS and bipolar transistors are defined by the operation of isolating these functional elements.

Thereafter, any native oxide films that may have been formed on the silicon substrate are removed to expose the surfaces of the elements, and the surface of the silicon substrate is oxidized to form a thin dummy gate oxide film of $SiO_2$ to a thickness of approximately 110 Å. Then, ions are injected into the regions 5, 6 for the NMOS and PMOS transistors via the gate oxide film in order to determine the impurity concentration level of related channel regions. The threshold voltages of the NMOS and PMOS are defined by the respective concentrations of injected ions. Subsequently, the dummy gate oxide film is removed and a real gate oxide film is formed in its place (typically to a thickness of approximately 110 Å). Gate electrodes 13 are formed on the gate oxide film. The allowable minimum size of each of the gate electrode 13 will be approximately 0.5 µm. A first polysilicon layer is used for the gate electrodes 13. Such polysilicon gate electrodes are particularly suited for a large scale integration of various elements because they can be automatically aligned with respective source/drain regions to be prepared in a subsequent step. The polysilicon gate electrodes are prepared by forming an undoped polysilicon film on the semiconductor substrate, transforming it to an n-type film by diffusing phosphorus into it and thereafter etching it with precision by means of a high precision etching technique such as reactive ion etching. Since the gate electrodes 13 are also used as a wired layer, the use of a layer of a silicide obtained by using a metal such as W, Mo, Ti, Pt, Ni or Co or a two layered structure having a silicide layer and a polysilicon layer obtained by causing any of the above mentioned metals and polysilicon to react with each other may be recommended.

Figure 4:
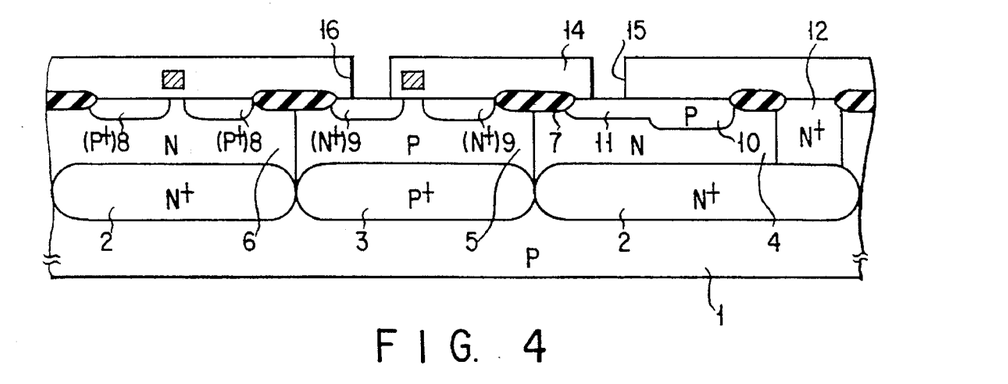

After oxidizing the surface of the gate polysilicon film and that of the substrate to form an oxide film of a thickness of approximately 100 Å, a pair of $p^+$ source/drain regions 8 and a pair of $n^+$ source/drain regions 9 are formed respectively in the well regions 6 and 5 by ion injection, using the gate electrodes 13 and the field oxide film regions 7 as masks as illustrated in FIG. 4. More specifically, the PMOS region, or the well region 6, and the bipolar transistor region, or the epitaxial region 4, are masked by a photoresist (not shown) when ions of an n-type impurity are injected into the NMOS region in the well region 5 to form $n^+$ source/drain regions 9, whereas the NMOS region 5 and the bipolar transistor region 4 are masked by photoresist (not shown) when ions of a p-type impurity are injected into the PMOS region 6 to form $p^+$ source/drain regions 8. Arsenic (As) is used for the p-type impurity, whereas boron or boron fluoride is used for the p-type impurity. In order to improve the reliability of the NMOS, a low concentration impurity-diffused region ($n^-$ region) may be formed adjacent to the high concentration impurity diffused region ($n^+$ region) 9 to transform the source/drain regions into a lightly doped drain source (LDD) structure. The n– region reduces the potential level of any high potential electric fields that may be generated in the vicinity of the n+ drain regions 9 and suppresses the generation of hot carriers. Thereafter, a p-type base region including an external base region 10 and an internal base region 11 is formed on the bipolar transistor.

Thereafter, the surface of the wafer including the areas of the gate electrodes 13 is covered by an interlayer insulation film 14 formed to a thickness of approximately 3,000 Å. A multi-layer film typically including a non-doped $CVDSiO_2$ film and a doped glass film such as BPSG is normally used for the interlayer insulation film 14. Since the fluidity of a glass film can be modified by heat treatment depending on the extent of boron or phosphorus doping, it is advantageously used to provide a flat surface to the LSI device. Additionally, since a phosphorus-glass film getters harmful alkali metal ions, it can also be utilized as a passivation film if such a glass film is used. The interlayer insulation film 14 may be realized in the form of a three layered structure additionally including a non-doped $SiO_2$ film deposited to a thickness of 500 Å on the BPSG film. It can effectively prevent boron or phosphor in the BPSG film from eventually diffusing into the polysilicon film regions to be formed in a subsequent step to adversely affect the contacting property of the polysilicon film. Then, contact holes 15, 16 are formed in the respective areas of the insulation film 14 that cover the NMOS region 5 and the bipolar transistor region 4 in order to partially expose the source/drain regions 9 of the NMOS region 5 and the internal base region 11 of the bipolar transistor region 4.

Figure 5:
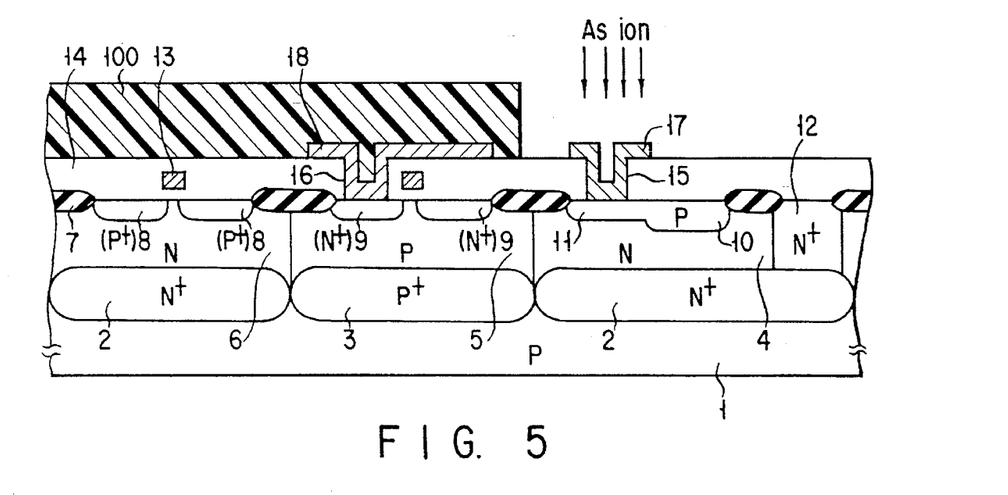
Figure 6:
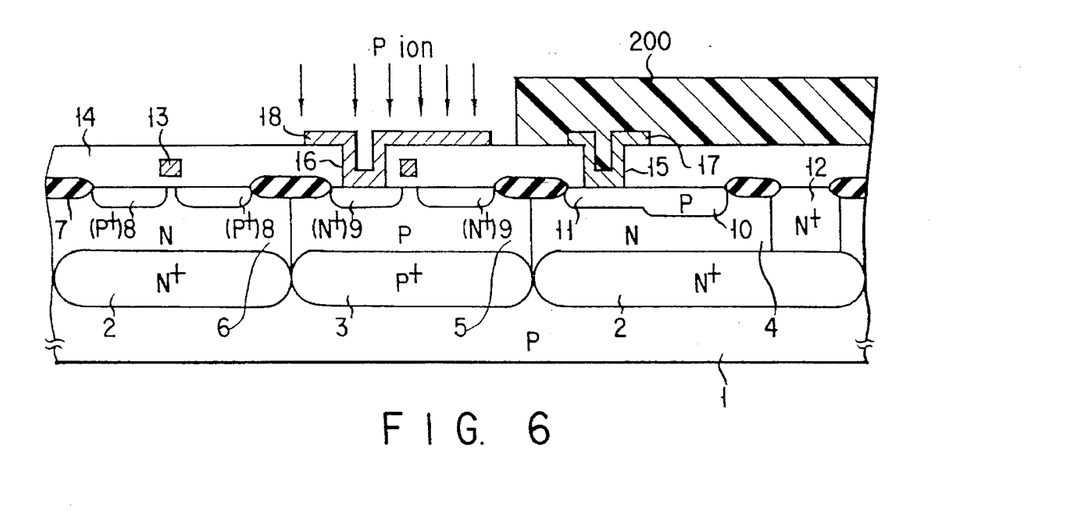

Thereafter, a second polysilicon layer is formed on the insulation film 14 by deposition to a thickness of approximately 2,000 Å and then an emitter electrode 17 is formed in the contact hole 15 of the bipolar transistor region 4 and adjacent to the base region 11, while a polysilicon wired layer 18 is formed in the contact hole 16 and on one of the source/drain regions 9 of the NMOS region 5, as illustrated in FIG. 5. The contact hole 16 for wiring typically has dimensions of 0.8×0.8 $\mu m^2$. Then, the area above the p well 5 and the n well 6 is covered by a photoresist layer 100 and ions of an emitter forming impurity such as As are injected only into the emitter electrode region 17 typically at 40 keV to a concentration of $1\times10^{16}/cm^2$ in order to dope the emitter electrode with As. After removing the photoresist layer 100, the area above the bipolar transistor region 4 is covered by a new photoresist layer 200 as illustrated in FIG. 6. Then, phosphorus ions are injected into the wired layer region 18 typically at 40 keV to a concentration of $1\times10^{16}/cm^2$ by means of a photolithography technique.

Figure 7:
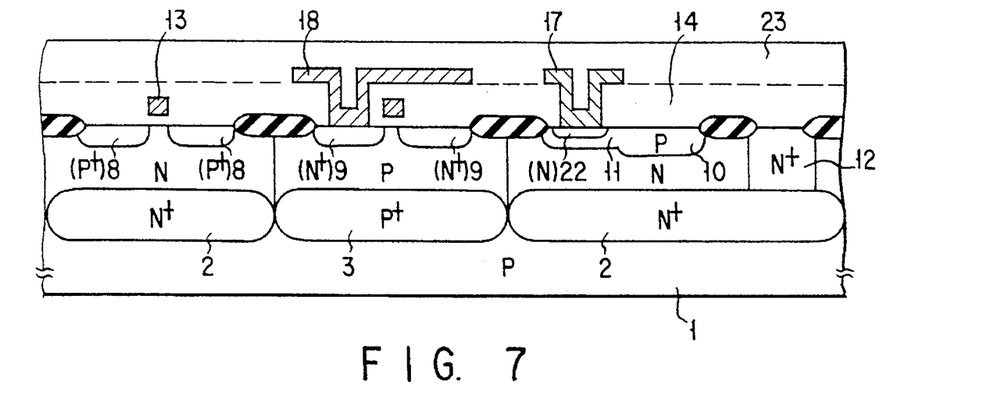

After removing the photoresist layer 200, a multilayered structure 23 including a non-doped $CVDSiO_2$ film and a BPSG interlayer insulation film is formed to a thickness of approximately 8,000 Å by deposition. Thereafter, the multilayered structure 23 is made to reflow to produce a flat surface to the semiconductor device. Note that the heat applied to the device for the reflow is also utilized to diffuse As contained in the emitter electrode 17 into the internal base region 11 to form an emitter region 22. Then, contact holes 19 are formed through the interlayer insulation films 14, 23 as illustrated in FIG. 2 by using an appropriate technique such as anisotropic etching to partially expose the source/drain regions 8 of the PMOS, the polysilicon wired layer 18, the emitter electrode 17 and the $n^+$ region 12. Buried contacts 20 of tungsten are formed in the respective contact holes 19 by deposition, although the material that can be used for the buried contacts 20 is not limited to tungsten and any metals having a high melting point such as Mo may alternatively be used. Thereafter, metal wired layers having a given pattern and typically made of aluminum are formed on the interlayer insulation film 23. The metal wired layers 21 are electrically connected to the respective elements by way of the respective buried contacts 20 in the contact holes 19 as well as other related components such as the emitter electrode 17 and the polysilicon wired layer 18. A metal nitride film may be inserted as a barrier metal layer between the contacts 20 and the surface of the semiconductor substrate and/or the polysilicon wired layer 18 in order to avoid chemical reactions between the metals involved in the device such as tungsten and silicon in the semiconductor substrate if they are electrically connected. Then, the metal wired layers 21 and other appropriate components are covered by a passivation film for protection.

Figure 8:
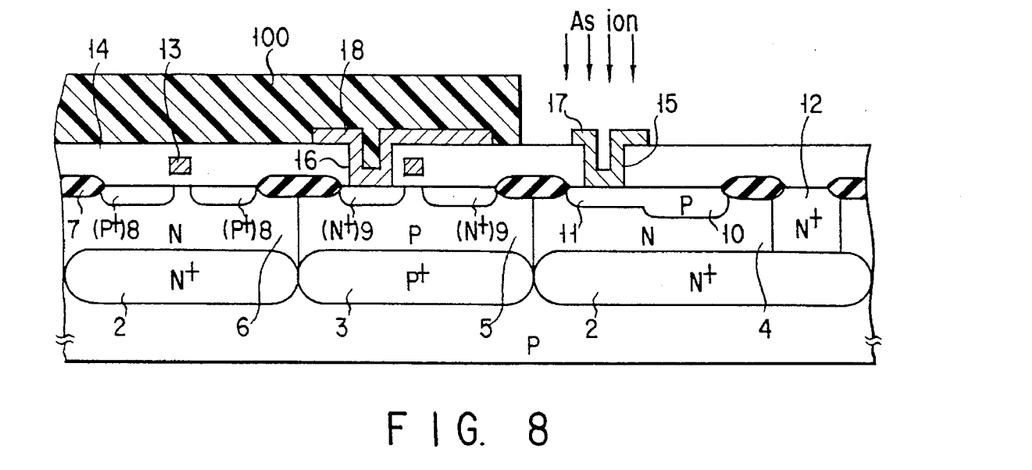
FIGS. 8 through 11 are sectional views of another embodiment of a BiCMOS semiconductor device of the present invention, showing different steps of the process of producing the device.
Figure 9:
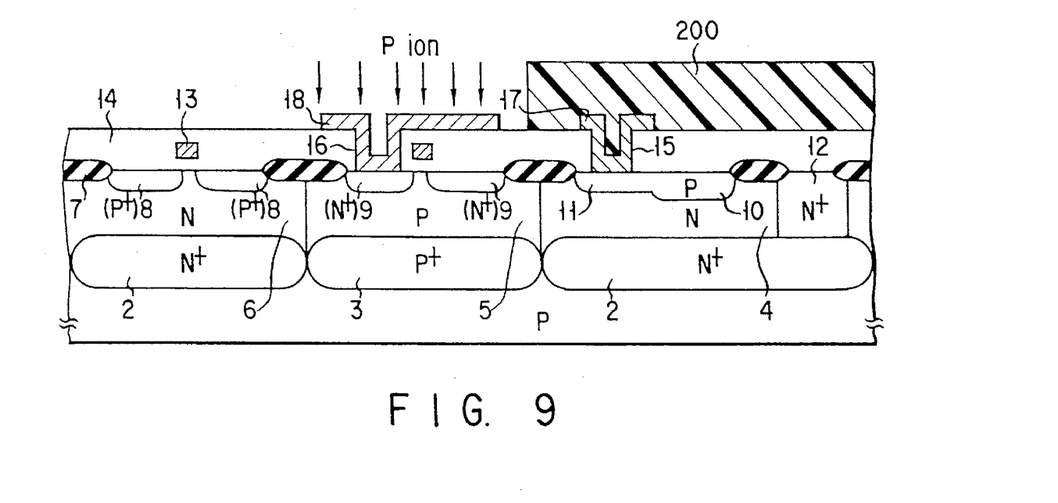
Figure 10:
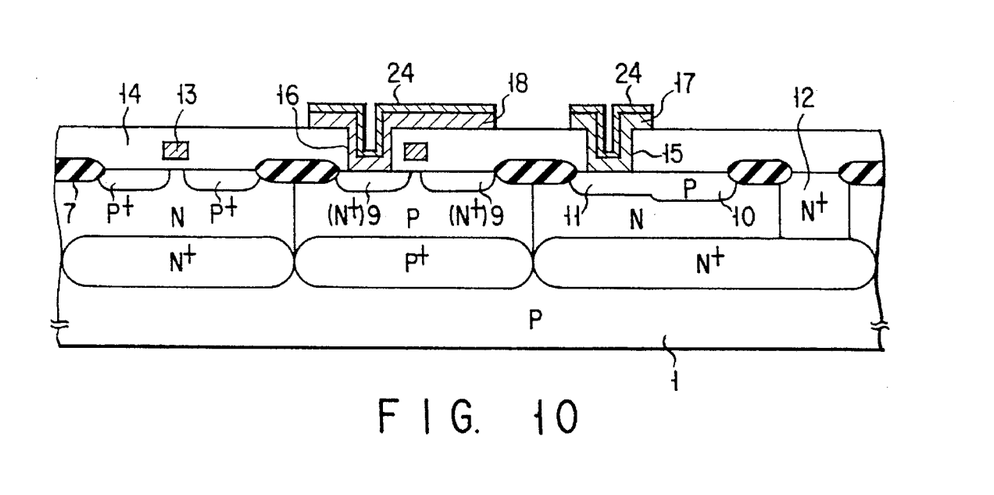

Now, the second embodiment of the invention will be described by referring to FIGS. 8 through 11, which illustrate sectional views of a BiCMOS semiconductor device during different steps of the producing processing. As shown in FIG. 10, a polysilicon wired layer 18 is formed on one of the $n^+$ regions 9, which may be a source region, of the device and connected to an external circuit. The wire layer 18 is doped with an impurity such as phosphorus that can effectively destroy any native oxide films that may be formed on silicon to an elevated concentration in order to reduce the contact resistance between it and the source region or a drain region disposed adjacent to it. On the other hand, an emitter electrode 17 is disposed on an emitter region 17 and doped with an impurity having a small diffusion coefficient such as As. Silicide films 24 are respectively formed to cover the polysilicon wired layer 18 and the emitter electrode 17 to reduce their electric resistance.

A semiconductor device having a configuration as illustrated in FIG. 2 is prepared in a manner as described below by referring to FIGS. 8 through 11. As shown in FIG. 8, a pair of buried n+ regions 2 are formed on a p-type silicon semiconductor substrate to provide respective areas for producing a PMOS transistor and a bipolar transistor, while a buried $p^+$ region 3 is formed on the same substrate to provide an area for producing an NMOS transistor. Thereafter, a thin n-type epitaxial layer 4 is formed on the semiconductor substrate to a thickness of approximately 1.2 μm. Then, an n well 6 for the PMOS and a p well 5 for the NMOS are formed respectively on one of the $n^+$ region 2 and the $p^+$ region 3 within the epitaxial layer 4. Both wells have a maximum impurity concentration level of approximately $1\times10^{17}/cm^3$. Then, another $n^+$ region 12 is formed on the n-type epitaxial region to be used for the bipolar transistor, extending from the surface and reaching as deep as the buried $n^+$ region 2. Thereafter, the different elements of the device are isolated from one another by selectively forming field oxide film regions 7 on the surface of the wafer and, subsequently, channel stopper regions (not shown) in the respective field oxide film regions 7 within the epitaxial layer 4. The field oxide film regions 7 normally has a thickness of approximately 6,000 Å. The regions of the PMOS, NMOS and bipolar transistors are defined by this operation of isolating these functional elements. Thereafter, any native oxide films that may have been formed on the silicon substrate are removed to expose the surfaces of the elements, and the surface of the silicon substrate is oxidized to form a thin dummy gate oxide film of $SiO_2$ to a thickness of approximately 110 Å. Then, ions are injected into the regions 5, 6 for the NMOS and PMOS transistors via the gate oxide film in order to determine the impurity concentration level of related channel regions. The threshold voltages of the NMOS and PMOS are defined by the respective concentrations of injected ions.

Subsequently, the dummy gate oxide film is removed and a real gate oxide film is formed in its place (typically to a thickness of approximately 110 Å). Gate electrodes 13 are formed on the gate oxide film. The allowable minimum size of each of the gate electrode 13 will be approximately 0.5 μm. A first polysilicon layer is used for the gate electrodes 13. The polysilicon gate electrodes are prepared by forming an undoped polysilicon film on the semiconductor substrate, transforming it to an n-type film by diffusing phosphorus into it and thereafter etching it with precision by means of a high precision etching technique such as reactive ion etching (RIE). After oxidizing the surface of the gate polysilicon film and that of the substrate to form an oxide film of a thickness of approximately 100 Å, a pair of $p^+$ source/drain regions 8 and a pair of $n^+$ source/drain regions 9 are formed respectively in the well regions 6 and 5 by ion injection, using the gate electrodes 13 and the field oxide film regions 7 as masks. More specifically, the PMOS region, or the well region 6, and the bipolar transistor region, or the epitaxial region 4, are masked by photoresist (not shown) when ions of an n-type impurity are injected into the NMOS region in the well region 5 to form n+ source/drain regions 9. The NMOS region 5 and the bipolar transistor region 4 are masked by photoresist (not shown) when ions of a p-type impurity are injected into the PMOS region 6 to form $P^+$ source/drain regions 8. Arsenic (As) is used for the p-type impurity, whereas boron or boron fluoride is used for the p-type impurity. Thereafter, a p-type base region including an external base region 10 and an internal base region 11 is formed on the bipolar transistor. The surface of the wafer including the areas of the gate electrodes 13 is covered by an interlayer insulation film 14 formed to a thickness of approximately 3,000 Å. A multi-layer film typically including a non-doped $CVDSiO_2$ film and a doped glass film such as BPSG is normally used for the interlayer insulation film 14.

Then contact holes 15, 16 are formed in the respective areas of the insulation film 14 that cover the NMOS region 5 and the bipolar transistor region 4 in order to partially expose the source/drain regions 9 of the NMOS region 5 and the internal base region 11 of the bipolar transistor region 4. Thereafter, a second polysilicon layer is formed on the insulation film 14 by deposition to a thickness of approximately 1,000 Å by using an ordinary photolithography technique such as active ion etching and then an emitter electrode 17 is formed in the contact hole 15 of the bipolar transistor region 4 and adjacent to the base region 11. A polysilicon wired layer 18 is formed in the contact hole 16 and on one of the source/drain regions 9 of the NMOS region 5. The contact hole 16 for wiring typically has dimensions $0.8 \times 0.8$ μm$^2$. Then, the area above the p well 5 and the n well 6 is covered by a photoresist layer 100 and ions of an emitter forming impurity such as As are injected only into the emitter electrode region 17 typically at 40 keV to a concentration of $1 \times 10^{16}$/cm$^2$ in order to dope the emitter electrode with As. After removing the photoresist layer 100, the area above the bipolar transistor region 4 is covered by a new photoresist layer 200 as illustrated in FIG. 9. Then, phosphorus ions are injected into the wired layer region 18 typically at 40 keV to a concentration of $1 \times 10^{16}$/cm$^2$ by means of a photolithograph technique. After removing the photoresist layer 200, a silicide film 24, e.g., a $WSi_x$ film, is formed by deposition to cover the emitter electrode 17 and the polysilicon wired layer 18. A patterning operation is conducted on the silicide film 24 by means of an ordinary photolithography technique such as RIE to finalize the silicide film 24 on the emitter electrode 17 and the polysilicon wired layer 18, as illustrated in FIG. 10. The silicide film 24 may be made of a substance other than $WSi_x$ such as a silicide of Mo, Ti or Ta. Alternatively, the silicide film 24 may be replaced by a film of a metal having a high melting point such as W, Mo, Ti or Ta.

Figure 11:
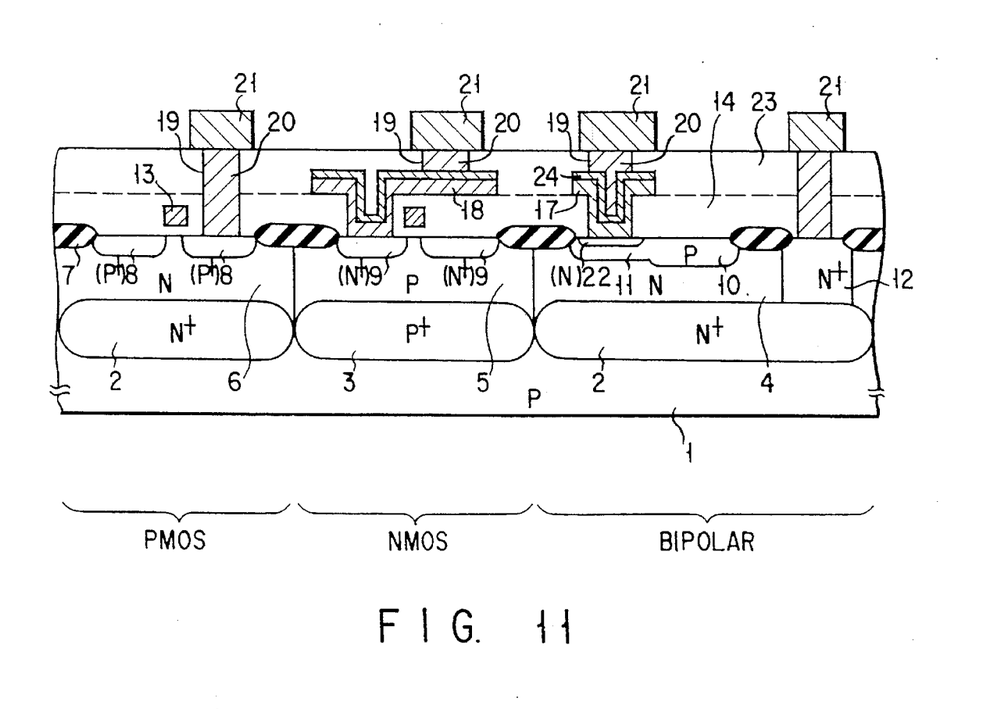

A barrier metal layer made of a nitride of a metal having a high melting point may be interposed between the silicide film 24 and the polysilicon wired layer 18 or the emitter electrode 17. After the patterning operation, the silicide film is heat treated at a temperature between 800° and 850° C. for 10 to 30 minutes to transform it to a stoichiometric composition. Thereafter, a multilayered structure 23 including a non-doped $CVDSiO_2$ film and a BPSG interlayer insulation film is formed to a thickness of approximately 8,000 Å by deposition. Thereafter, the multilayered structure 23 is made to reflow at approximately 850° C. to produce a flat surface to the semiconductor device. Note that the heat applied to the device for the reflow is also utilized to diffuse As contained in the emitter electrode 17 into the internal base region 11 to form an emitter region 22. Then, contact holes 19 are formed through the interlayer insulation films 14, 23 by using an appropriate technique such as anisotropic etching to partially expose the source/drain regions 8 of the PMOS, the polysilicon wired layer 18, the emitter electrode 17 and the $n^+$ region 12. Then, buried contacts 20 of tungsten are formed in the respective contact holes 19 by deposition. Thereafter, metal wired layers having a given pattern and typically made of aluminum are formed on the interlayer insulation film 23. The metal wired layers 21 are electrically connected to the respective elements by way of the respective buried contacts 20 in the contact holes 19 as well as other related components such as the emitter electrode 17 and the polysilicon wired layer 18. Then, the metal wired layers 21 and other appropriate components are covered by a passivation film for protection.

As described above in detail the first and second embodiments of the present invention each provides a BiCMOS LSI including a bipolar transistor provided with a contact realized in the form of a polysilicon wired layer having a minimum contact size of less than $0.8 \times 0.8$ μm$^2$, a contact resistance of less than 50Ω, an emitter resistance of less than 20Ω as well as an emitter depth of less than 0.1 μm and a maximum cutoff frequency greater than 10 GHz.

While masks are used in the preparation of the above embodiments to cover the appropriate components thereof when their polysilicon films are doped with an impurity having a low diffusion coefficient such as As as well as when they are doped with an impurity capable of effectively destroying any native oxide films such as phosphorus, the polysilicon films including the polysilicon layers 18 may alternatively be doped with As over their entire areas and thereafter with phosphorus to only the polysilicon wired layers 18 with the remaining areas including the emitter electrodes 17 masked by a photoresist layer because the polysilicon wired layers would not noticeably change their property if they contain an impurity having a low diffusion coefficient to a considerable concentration. Then, a step of masking the device is eliminated to simplify the overall process of manufacturing such devices. The heat treatment operation for producing emitter regions is also carried out at a relatively low temperature below 850° C., if such is the case.

The method of the present invention can be applied to down-sized 4M-bit BiCMOS SRAMs as well as to BiCMOS devices of the following generations that will have even reduced dimensions. Since a $WSi_2$ polycide is used for both the wired layers and the emitter electrodes of such a device, they need to be doped with phosphorus which is capable of effectively destroying any native oxide films formed on the polysilicon interface. On the other hand, the emitter regions are required to have an ever smaller thickness as the device is miniaturized, making the use of phosphorus for doping less feasible because of its high divisibility. Meanwhile, the emitter regions need not necessarily be doped with phosphorus because any native oxide films that may be formed on the p regions thereof are as thin as 5 to 12 Å. Thus, the method of the present invention involving the use of different impurities for doping provide an effective way for preparing very small SRAMs. A semiconductor integrated circuit device according to the present invention can be used not only for an SRAM but also a memory device of any other type such as DRAM and, therefore, will find applications in ionic circuits such as 2-input NAND circuits as well as other circuits.

As described above in detail, a semiconductor integrated circuit device having a BiCMOS feature can remarkably reduce the contact resistance of its polysilicon wiring and, at the same time, reduce the thickness of the emitter regions to a reasonably low level.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor integrated circuit device comprising:

a semiconductor substrate;

a bipolar transistor formed on said substrate and including an emitter region;

a MOS transistor formed on said semiconductor substrate and including n-type source and drain regions;

an emitter electrode formed on the emitter region of said bipolar transistor and made of polysilicon doped with a first n-type impurity having a small diffusion coefficient;

a polysilicon wired layer formed on one of said n-type source and drain regions and doped with a second n-type impurity, said second n-type impurity removing undesired native oxide films on the semiconductor substrate, said polysilicon wired layer being doped with the second n-type impurity to the exclusion of the first n-type impurity;

a high melting-point metal film formed on the surface of said emitter electrode and said polysilicon wired layer, said film being a silicide film selected from the group consisting of tungsten silicide, molybdenum silicide, titanium silicide and tantalum silicide; and a barrier metal disposed between said silicide film and said polysilicon wired layer.

2. A semiconductor integrated circuit device comprising:

a semiconductor substrate;

a bipolar transistor formed on said substrate and including an emitter region;

a MOS transistor formed on said semiconductor substrate and including n-type source and drain regions;

an emitter electrode formed on the emitter region of said bipolar transistor and made of polysilicon doped with a first n-type impurity having a small diffusion coefficient;

a polysilicon wired layer formed on one of said n-type source and drain regions and doped with a second n-type impurity, said second n-type impurity removing undesired native oxide films on the semiconductor substrate, said polysilicon wired layer being doped with the second n-type impurity to the exclusion of the first n-type impurity;

a high melting-point metal film formed on the surface of said emitter electrode and said polysilicon wired layer, said film being a silicide film selected from the group consisting of tungsten silicide, molybdenum silicide, titanium silicide and tantalum silicide; and a barrier metal disposed between said silicide film and said emitter electrode.

3. A semiconductor integrated circuit device comprising:

a semiconductor substrate;

a bipolar transistor formed on said substrate and including an emitter region;

a MOS transistor formed on said semiconductor substrate and including n-type source and drain regions;

an emitter electrode formed on the emitter region of said bipolar transistor and made of polysilicon doped with a first n-type impurity having a small diffusion coefficient; and a polysilicon wired layer formed on one of said n-type source and drain regions and doped with a second n-type impurity, said second n-type impurity removing undesired native oxide films on the semiconductor substrate, said polysilicon wired layer being doped with the second n-type impurity to the exclusion of the first n-type impurity.

4. A semiconductor integrated circuit device according to claim 3, wherein said second n-type impurity is phosphorus.

5. A semiconductor integrated circuit device according to claim 3, wherein high melting-point metal silicide film is formed on the surface of said emitter electrode and said polysilicon wired layer.

6. A semiconductor integrated circuit device according to claim 5, wherein said silicide film is one of tungsten silicide, molybdenum silicide, titanium silicide and tantalum silicide.

7. A semiconductor integrated circuit device according to claim 3, wherein said first n-type impurity having a small diffusion coefficient is As.

8. A semiconductor integrated circuit device according to claim 3, wherein said first n-type impurity having a small diffusion coefficient is Sb.

9. A semiconductor integrated circuit device comprising:

a semiconductor substrate;

a bipolar transistor formed on said substrate and including an emitter region;

a MOS transistor formed on said semiconductor substrate and including n-type source and drain regions;

an emitter electrode formed on the emitter region of said bipolar transistor and made of polysilicon doped with only a first n-type impurity having a small diffusion coefficient; and a polysilicon wired layer formed on one of said n-type source and drain regions and doped with only a second n-type impurity, said second n-type impurity removing undesired native oxide films on the semiconductor substrate.

\* \* \* \* \*